US008829334B2

(12) United States Patent
Janson

(10) Patent No.: US 8,829,334 B2
(45) Date of Patent: Sep. 9, 2014

(54) THERMO-PHOTOVOLTAIC POWER GENERATOR FOR EFFICIENTLY CONVERTING THERMAL ENERGY INTO ELECTRIC ENERGY

(75) Inventor: Siegfried W. Janson, Redondo Beach, CA (US)

(73) Assignee: The Aerospace Corporation, El Segundo, CA (US)

(*) Notice: Subject to any disclaimer, the term of this patent is extended or adjusted under 35 U.S.C. 154(b) by 66 days.

(21) Appl. No.: 12/978,556

(22) Filed: Dec. 25, 2010

(65) Prior Publication Data

US 2011/0094572 A1 Apr. 28, 2011

Related U.S. Application Data

(62) Division of application No. 11/602,828, filed on Nov. 20, 2006, now abandoned.

(51) Int. Cl.

| | |
|---|---|
| ***H01L 31/09*** | (2006.01) |
| ***H01K 1/14*** | (2006.01) |
| ***F21V 13/08*** | (2006.01) |
| ***H01K 7/00*** | (2006.01) |
| ***H01K 1/26*** | (2006.01) |
| ***H01K 1/32*** | (2006.01) |
| ***H01K 3/00*** | (2006.01) |

(52) U.S. Cl.

CPC *F21V 13/08* (2013.01); *H01K 1/14* (2013.01); *H01K 7/00* (2013.01); *H01K 1/26* (2013.01); *H01K 1/325* (2013.01); *H01K 3/005* (2013.01); *H01K 1/32* (2013.01)

USPC ............ 136/253; 136/244; 136/248; 136/252

(58) Field of Classification Search

USPC .................................................. 136/248, 253

See application file for complete search history.

(56) References Cited

U.S. PATENT DOCUMENTS

| | | | |
|---|---|---|---|
| 3,037,139 | A | 5/1962 | Myers |
| 3,611,258 | A | 10/1971 | Kolakowski |
| 3,622,832 | A | 11/1971 | Schlessel et al. |
| 4,701,663 | A | 10/1987 | Kawakatsu et al. |
| 4,707,632 | A | 11/1987 | Walsh |
| 4,829,210 | A | 5/1989 | Benson et al. |
| 5,600,483 | A | 2/1997 | Fan et al. |

(Continued)

OTHER PUBLICATIONS

Chen et al., "Fibrous selective emitter structures from sol-gel process", NREL conference on thermophotovoltaic generation of electricity, 1999.*

(Continued)

*Primary Examiner* — Matthew Martin

(74) *Attorney, Agent, or Firm* — Claude A. S. Hamrick; IPXLAW Group LLP

(57) ABSTRACT

A thermo-photovoltaic power generator for efficiently converting thermal energy into electric energy including a selective thermal emitter for receiving thermal energy and emitting thermal radiation with black body emissivity over a range of wavelengths, low-bandgap photovoltaic cells responsive to thermal radiation at wavelengths within a particular band of said range of wavelengths and operative to convert such thermal radiation to electric energy, and a band pass filter disposed between the thermal emitter and the photovoltaic cells for transmitting thermal radiation from the emitter at wavelengths within the particular band to the photovoltaic cells, and for reflecting thermal radiation from the emitter at wavelengths outside the particular band back to the emitter.

19 Claims, 13 Drawing Sheets

(56) References Cited

U.S. PATENT DOCUMENTS

| | | | | |
|---|---|---|---|---|
| 5,611,870 | A * | 3/1997 | Horne et al. | 136/253 |
| 6,583,350 | B1 * | 6/2003 | Gee et al. | 136/253 |
| 6,611,085 | B1 | 8/2003 | Gee et al. | |
| 7,487,781 | B2 | 2/2009 | Horiuchi et al. | |
| 2003/0079773 | A1 * | 5/2003 | Salstrom | 136/253 |
| 2003/0132705 | A1 | 7/2003 | Gee et al. | |
| 2004/0239228 | A1 | 12/2004 | Perlo et al. | |
| 2006/0071585 | A1 | 4/2006 | Tang et al. | |
| 2007/0107773 | A1 * | 5/2007 | Fork et al. | 136/256 |
| 2008/0116779 | A1 | 5/2008 | Janson | |

OTHER PUBLICATIONS

Catchpole, "Novel Application for Surface Plasmons in Photovoltaics", 3rd World Conference on Photovoltaic Energy Conversion, 2003.*

* cited by examiner

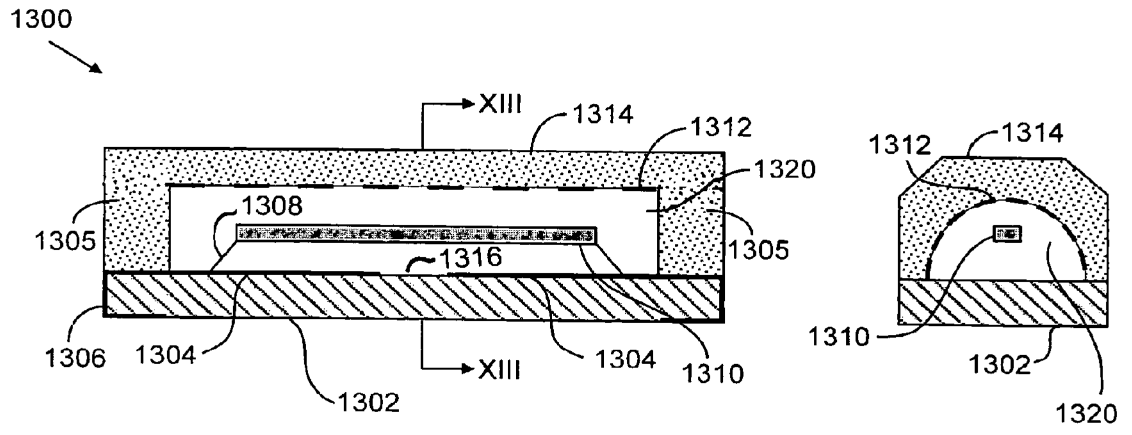
FIG. 13A
FIG. 13B
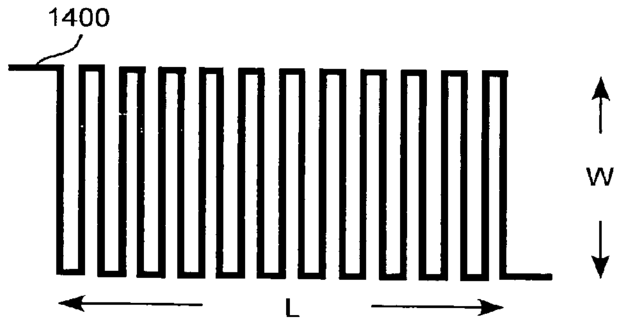
FIG. 14

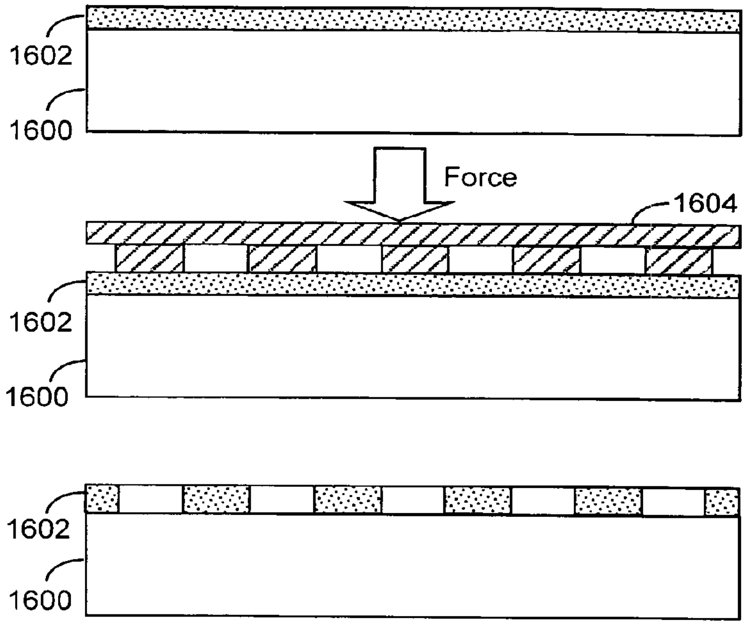
FIG. 16A
FIG. 16B
FIG. 16C
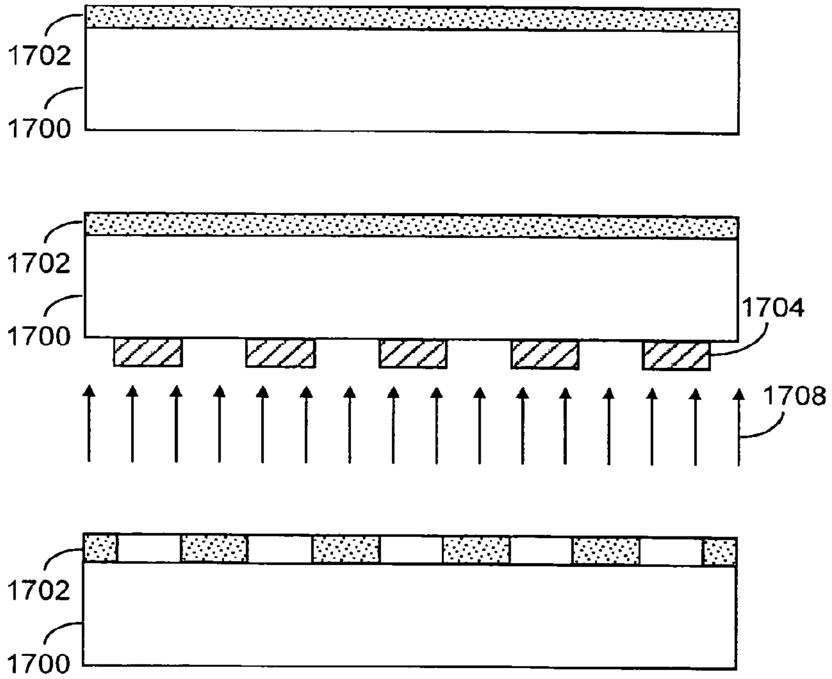
FIG. 17A
FIG. 17B
FIG. 17C

THERMO-PHOTOVOLTAIC POWER GENERATOR FOR EFFICIENTLY CONVERTING THERMAL ENERGY INTO ELECTRIC ENERGY

RELATED APPLICATIONS

This application is a Division of U.S. patent application Ser. No. 11/602,828, filed Nov. 20, 2006 (now abandoned) and entitled "Micro-nanostructured films for high efficiency thermal light emitters" the entire disclosure of which is expressively incorporated herein by reference, and to which priority is hereby claimed in this Application.

BACKGROUND OF THE INVENTION

The present invention generally relates to thermo-photovoltaic power generators and thermal light emitters and, more particularly, to such generators and light emitters including a thermal source of radiation and a film with openings formed therein for selectively passing predetermined wavelengths of radiation, and reflecting other wavelengths of the radiation.

A conventional incandescent light bulb is about 10% efficient in converting input energy into visible light in the wavelength range of 400-to-750 nm, where most of the input energy is radiated as infrared light with wavelengths longer than 750 nm. FIG. 1 shows the emission spectrum of a blackbody at ~3000° K simulating that of a tungsten filament in a conventional light bulb. Human eyes are sensitive to light with wavelengths between ~400 and 750 nm, and a large portion of the emitted light from the tungsten filament is at longer wavelengths than human eyes can detect. About 90% of the input electrical power is converted into these invisible infrared photons, many of which are absorbed in the bulb envelope and thereby heat the envelope. If these longer wavelengths can be reflected back towards the hot filament before reaching the bulb envelope, while allowing the visible wavelengths to pass through the envelope, the unseen heat energy will be re-absorbed by the filament, and less input electric power will be required to maintain visible light output, thus improving the efficiency of the bulb. In the ideal case where infrared reflection is perfect and there is no thermal conduction of heat from the filament to the bulb envelope, the infrared reflecting bulb will be an order-of-magnitude more efficient than a conventional light bulb.

A conventional approach to fabricating a selective long-wavelength reflector, or "hot mirror," is to use one or more dielectric stacks composed of three layers with alternating indices of refraction. This type of hot mirror is also called a dielectric interference mirror or dichroic mirror. At least three depositions of materials, each with a well-defined thickness requirement to create the desired optical interference, may be needed to produce a conventional hot mirror. A typical single stack dichroic mirror may produce high transmission in the visible wavelength range, but the long wavelength reflection range is not wide enough to reflect most of the spectrum emitted by a 3000° K blackbody. FIG. 2 shows the spectral reflectance of a conventional single stack dichroic mirror. As depicted, the second passband may start at about 1100 nm with additional passbands occurring at even longer wavelengths, failing to reflect most of the IR radiation that extends up to ~4 microns. Single stack dichroic hot mirrors typically reflect the wavelength range from ~750-to-1250 nm while advanced multi-stack hot mirrors may reflect from ~750-to-2000 nm. For a 3000° K black body, single and multi-stack hot mirrors usually reflect about 32% and 62%, respectively, of the total photon energy emitted by a filament.

As the thickness of each layer of the dichroic mirrors determines the wavelength band of the reflected light, each layer needs to be deposited with high precision. Also, the dichroic mirror requires a number of layers to reflect most of the IR energy emitted by a filament. Moreover, each of the multiple layers needs to be uniformly coated on the light bulb surface, which may translate into high manufacturing cost. Thus, there is a strong need for a reflector that can operate as a low-pass filter and can be applied to conventional light bulb design in a cost-effective manner.

SUMMARY OF THE INVENTION

In one embodiment, a generator includes a source for generating thermal radiation and a reflective film including an array of sub-wavelength sized holes for transmitting a portion of the radiation shorter than a cutoff wavelength and reflecting the rest of the radiation back to the source.

In another embodiment, a device for generating electric current includes a source for generating heat energy, a selective thermal emitter operative to receive the heat energy and to emit thermal radiation, a housing enclosing the source and selective thermal emitter and having a transparent window through which the thermal radiation from the selective thermal emitter passes; a photovoltaic cell located outside the cavity to receive the thermal radiation passing through the window and operative to convert the received thermal radiation into an electric current, and a reflective film interposed between the window and the photovoltaic cell and including a plurality of sub-wavelength sized openings formed therein, the size and shape of the openings being determined to transmit radiation having wavelengths shorter than a first predetermined threshold wavelength and to reflect radiation having wavelengths exceeding the first threshold wavelength back to the source such that the source absorbs at least a portion of the radiation reflected by the film.

In yet another embodiment, a thermo-photovoltaic power generator for efficiently converting thermal energy into electric energy includes a selective thermal emitter having micro-patterned structures for receiving thermal energy and emitting thermal radiation with black body emissivity over a range of wavelengths, low-bandgap photocells responsive to thermal radiation at wavelengths within a particular band of said range of wavelengths and operative to convert such thermal radiation to electric energy, and a band pass filter disposed between the thermal emitter and the photocells for transmitting thermal radiation from the emitter at wavelengths within the particular band to the photocells, and for reflecting thermal radiation at wavelengths outside the particular band back to the emitter.

These and other embodiments, features, aspects and advantages of the present invention will become better understood with reference to the following drawings, description and claims.

BRIEF DESCRIPTION OF THE DRAWINGS

FIG. 13A is a schematic cross sectional view of a further embodiment of a light bulb in accordance with the present invention;

FIG. 13B is a schematic cross sectional view of the light bulb shown in FIG. 13A, taken along the line XIII-XIII;

FIG. 14 is a schematic diagram of an exemplary planar filament of a type that might be used for the light bulbs of FIGS. 12A-13B.

FIGS. 16A-16C show exemplary steps that might be followed informing another embodiment of a sub-wavelength aperture array on a substrate in accordance with the present invention;

FIGS. 17A-17C show exemplary steps that might be followed informing yet another embodiment of a sub-wavelength aperture array on a substrate in accordance with the present invention;

DETAILED DESCRIPTION OF THE EMBODIMENTS

The following detailed description is of the best currently contemplated modes of carrying out the invention. The description is not to be taken in a limiting sense, but is made merely for the purpose of illustrating the general principles of the invention because the scope of the invention is best defined by the appended claims.

As will be described below, various embodiments of the present invention provide thermal light emitters, each having a heat source and a sub-wavelength aperture array for selectively passing visible light but reflecting long-wavelength thermal radiations back to the heat source. Unlike existing approaches that use a dichroic mirror of multiple layers to limit the radiated wavelengths, the sub-wavelength aperture array of the present invention is reflective of thermal radiation outside the visible spectrum but has a plurality of sub-wavelength sized holes or apertures or openings that pass visible light thus forming a low-pass filter. The shape and dimension of the sub-wavelength sized holes are set to determine the cutoff wavelength. The reflected energy is returned and re-absorbed by the heat source, thus increasing the operational efficiency of the thermal light emitter.

Figure 1:
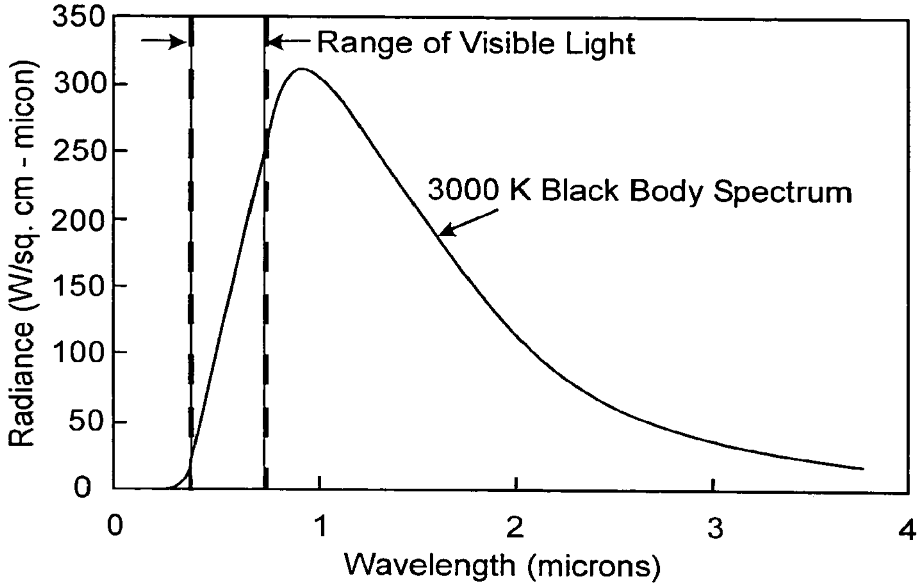
FIG. 1 shows the emission spectrum of a blackbody at ~3000° K.
Figure 2:
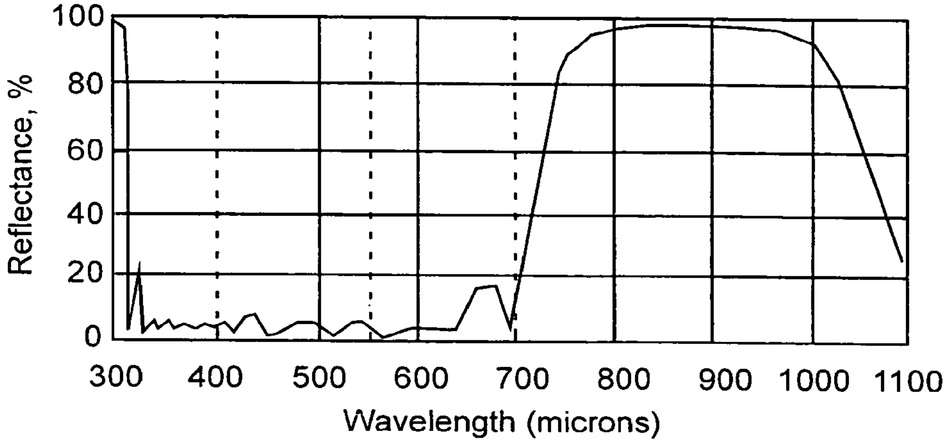
FIG. 2 shows the spectral reflectance of a conventional single stack dichroic mirror.
Figure 3:
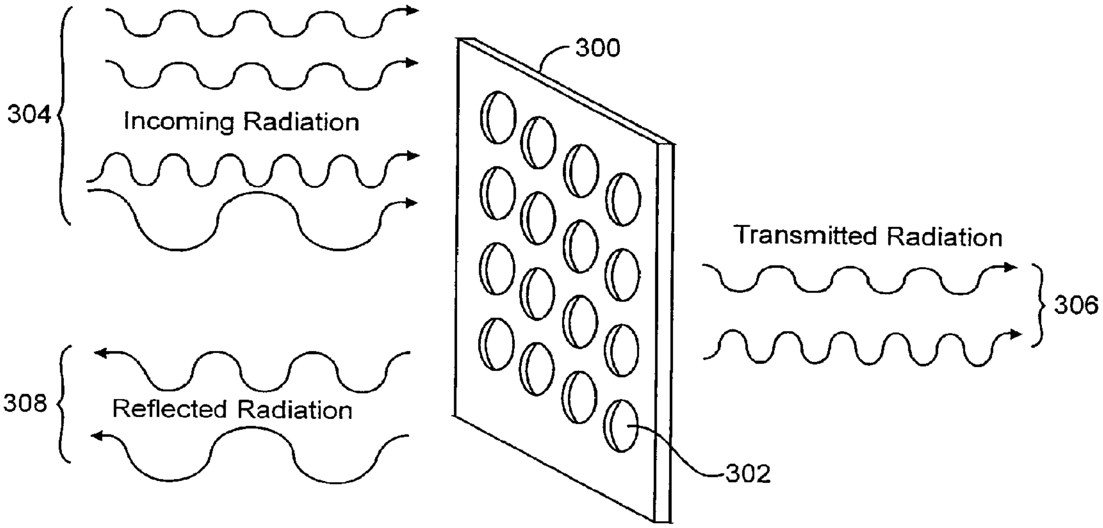
FIG. 3 shows a sub-wavelength aperture array operating as a hot mirror in accordance with the present invention.

FIG. 3 shows a reflective sub-wavelength aperture array 300 operating as a hot mirror for incoming radiation 304 that may have a wide spectral range. As depicted, the film 300 includes multiple holes or apertures or openings 302 that are sized to let the short wavelength portion 306 of the incoming radiation pass through and to reflect long wavelength portion 308. In general, wavelengths that are longer than .about.2.5 times the aperture diameter are reflected by the film while shorter wavelengths are transmitted through the apertures, i.e., the film 300 operates as a low-pass filter.

Figure 4:
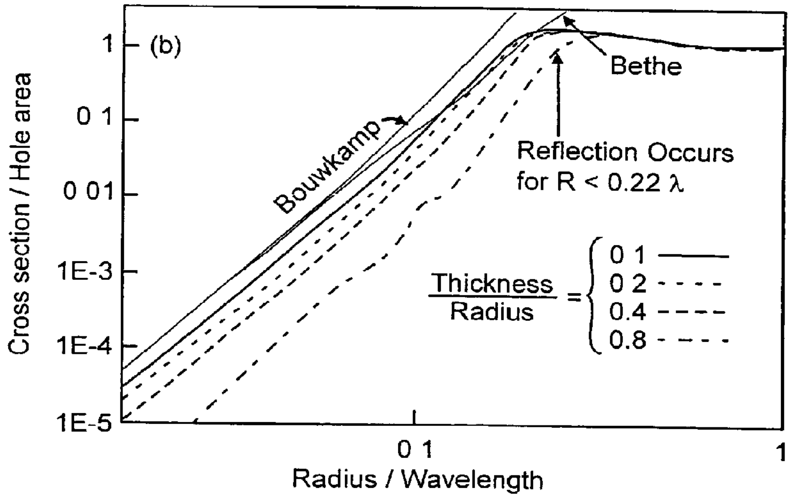
FIG. 4 shows calculated transmission fractions of the sub-wavelength aperture array of FIG. 3.

FIG. 4 shows calculated transmission fractions of circular apertures 302 as a function of aperture size and the thickness of the film 300. The term transmission fraction refers to the effective cross section of the apertures divided by the actual aperture area. As depicted, wavelengths that are longer than ~2.5 times the aperture diameter are reflected, regardless of the film thickness. As such, for transmission of visible light, typically ranging from 400 to 750 nm, the aperture diameter needs to be ~300 nm. Smaller diameters can be used to filter out red and yellow light thereby creating predominantly blue or green light. Non-circular apertures or a distribution of aperture size can be used to adjust the overall perceived color or color temperature for white light applications. The film 300 may be a patterned metallic (e.g., aluminum, silver, gold, nickel, etc.) film with a thickness greater than 30 nm to produce reflectivity in excess of 90%. The film 300 may be freestanding or deposited on a transparent substrate such as glass, quartz, etc. For instance, the film 300 may be formed on the surface of a light bulb envelope such that the long wavelength portion 308 may be reflected back to the bulb's filament.

Figure 5A:
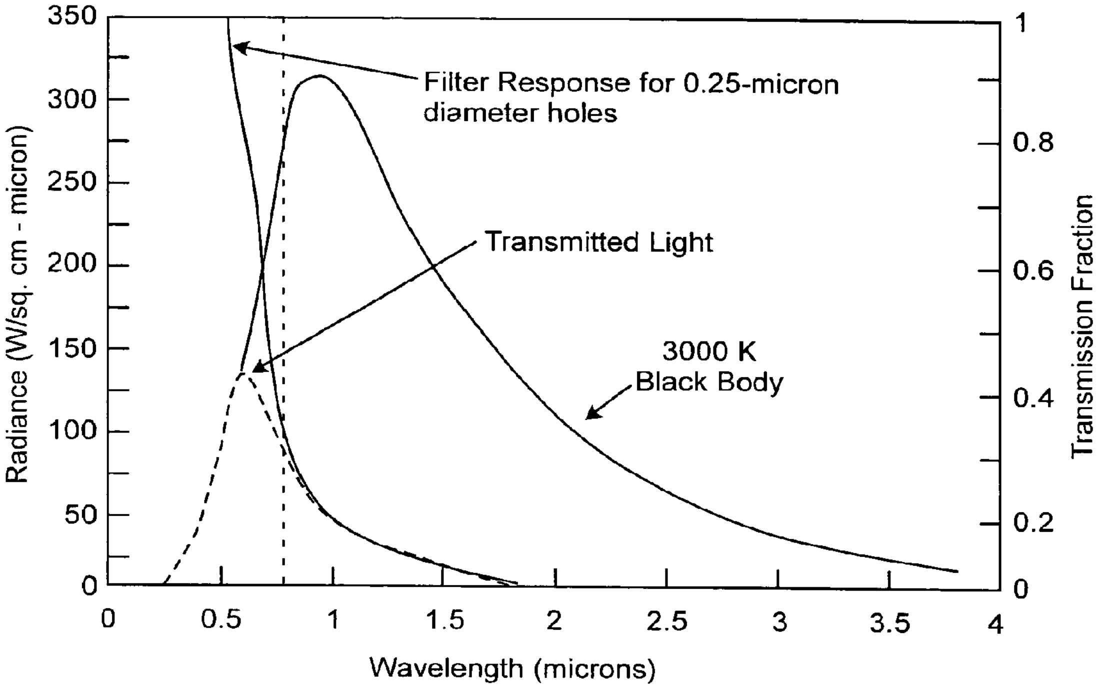
FIGS. 5A-5B show the emission spectra of a blackbody, superimposed on the transmission curves of embodiments of the film in FIG. 3.

FIG. 5A shows the emission spectrum of a blackbody at 3000.degree. K, superimposed on the transmission curve of a sub-wavelength aperture array of the type depicted in FIG. 3, wherein the film has circular apertures of diameter 0.25 microns. As depicted, the film reflects most of the infrared light and operates as a low-pass filter. The transmitted infrared energy can be less than the transmitted visible energy, which may yield a high operational efficiency of the light source.

Figure 5B:
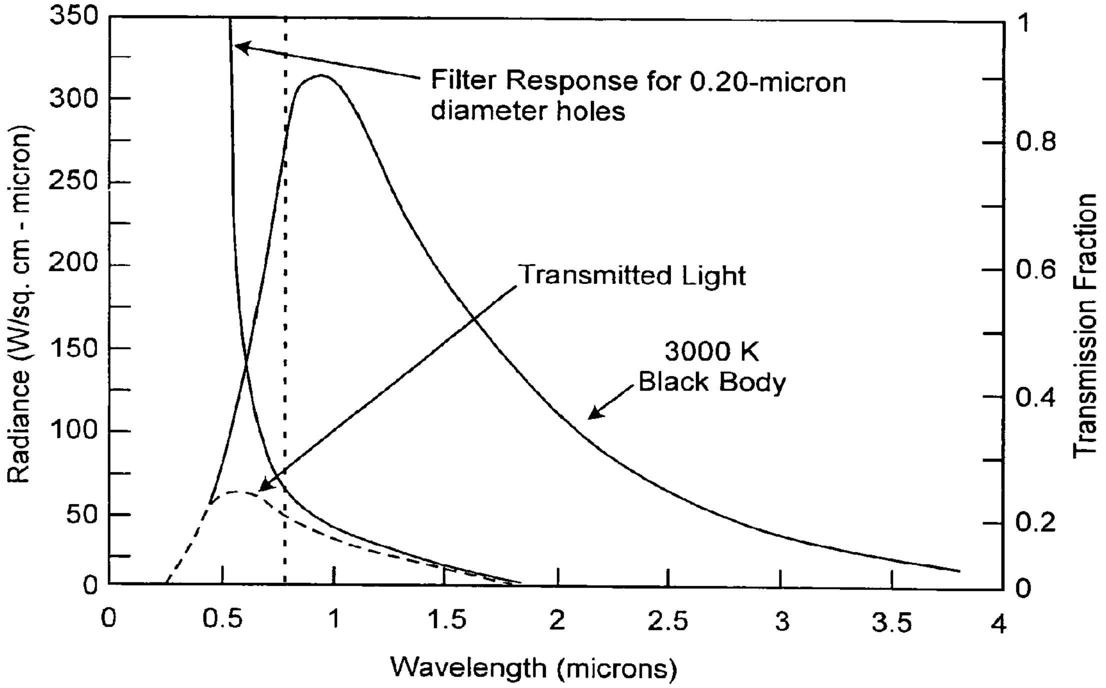

FIG. 5B shows another emission spectrum of a blackbody at ~3000° K, superimposed on the transmission curve of a film of the type described in FIG. 3, wherein the film has circular apertures of diameter 0.2 microns. As can be noticed, in contrast to the aperture size of FIG. 5A, the decrease in aperture diameter will shift the transmission curve of the film toward blue, making the users perceive an increase in intensity of blue light. It will also be noticed that the film having smaller apertures will reflect a larger portion of the infrared light.

The film 300 may be applied to the envelope of a thermal light emitter having an enclosed filament or other thermal emitter equivalent to the filament. More specifically, the film 300 may be positioned to surround the hot filament or be formed on a light emitting surface that reflects infrared radiation back towards the thermal emitter while allowing the short wavelength visible light to escape in a preferred direction. Solid or unapertured films may be used on those of areas of light reflecting envelope where total light reflection is intended, and films with apertures may be used where only the shorter wavelength light is intended to pass through. Applications may include, but are not limited to, high efficiency incandescent light bulbs, high efficiency micromachined light bulbs to replace light emitting diodes (especially white LEDs that are typically UV-pumped fuorescents), and photovoltaic thermal energy converters.

Figure 6:
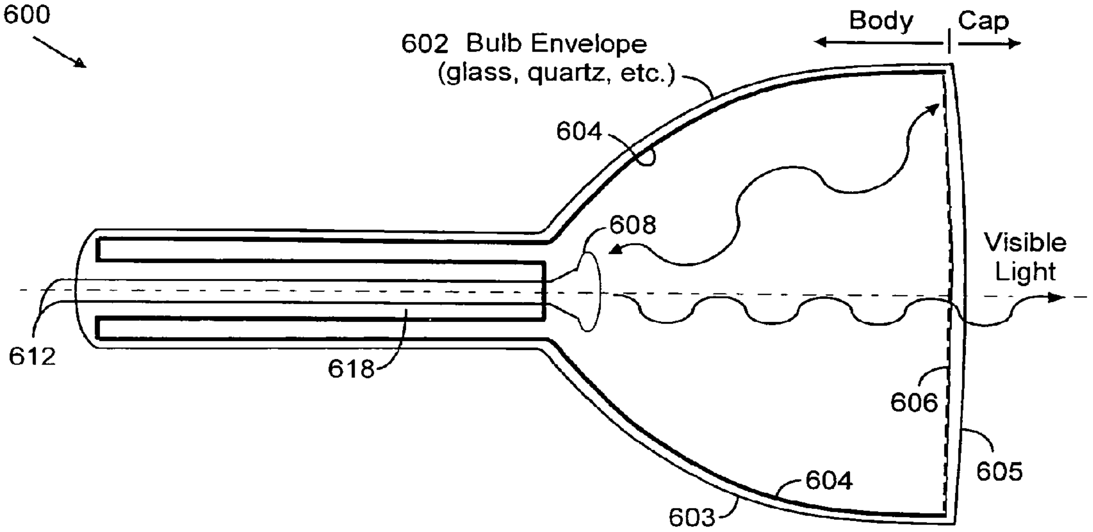
FIG. 6 is a schematic cross sectional view of an incandescent light bulb having a sub-wavelength aperture array in accordance with the present invention.

FIG. 6 is a schematic cross sectional view of an incandescent light bulb shown at 600 and including an envelope 602 of glass, quartz, or other suitable material. The interior surfaces of the envelope side portion 603 are coated with a totally reflective film 604 while the interior surface of the envelope end portion or cap 605 is coated with a sub-wavelength aperture array 606 in accordance with the present invention. More specifically, in addition to the envelope 602, the light bulb 600 includes a filament 608 for emitting radiant energy and a filament holder 618 through which power leads 612 pass. The cap 605 is a disk made of an optically transparent material, such as glass, quartz, etc., and coated on its interior surface with a sub-wavelength aperture array 606. This cap can be flat or curved. The body portion of the bulb envelope 602, may be joined with the cap 605 at the last step of manufacture. The filament 608 may have a linear, a planar spiral or a non-planar spiral shape. A linear shaped filament may be in the form of an elongated coil.

Almost all of the interior of the body 614, with the exception of the filament 608 may be coated with a solid film 604. The film 604 is preferably a totally reflective thin metallic film and may be applied using traditional thin film deposition techniques, such as evaporation or sputtering. The film 604 may be highly reflective to infrared radiation to provide a high visible light generation efficiency.

As suggested above, the sub-wavelength aperture array 606 applied to the cap 605 a thin metallic film with .about.300 nm diameter apertures formed on the interior of the cap to allow visible light to escape while keeping longer wavelengths within the reflective cavity for eventual re-absorption by the filament 608. Herein, the term reflective cavity refers to the interior space of the light bulb 600 surrounded by the solid film 604 and sub-wavelength aperture array 606. The film 606 can be applied using a number of techniques, such as lift-off patterning, masked reactive etching, shadow mask deposition, and direct-write laser deposition to create the metallic apertured thin film. Lift-off patterning discussed below is a preferred batch-fabrication technique that can pattern a variety of metals on many different substrates (bulb envelope materials).

The bulb envelope 602 and the solid film 604 are shaped to generally form a paraboloidal reflector, and the filament 608 is located in or near the focus of the paraboloid. The paraboloidal reflector is of the type used to generate floodlights or directed beam lights, for example. As a variation, the bulb envelope 602 and the solid film 604 could be in the form of a parabolic reflector with the filament 608 located in or near the focus of the parabola. The parabolic reflector might be of the type used to generate linear lights or fan beam lights, for example.

A typical 100-Watt incandescent bulb has an output of ~17 lumens/Watt and a 23 Watt fluorescent bulb has an output of ~65 lumens/Watt. Moreover, the most efficient white light LEDs have an output of ~50 lumens/Watt. An incandescent light bulb of the type described and shown at 600 with integrated reflector and aperture array may achieve output levels of ~90 lumens/Watt based on a 5× increase in efficiency compared to a standard incandescent design. For example, the light bulb 600 may be radiation-hard, operate over a broader temperature range, and provide a common technology for use in generating a variety of perceived colors.

Figure 7A:
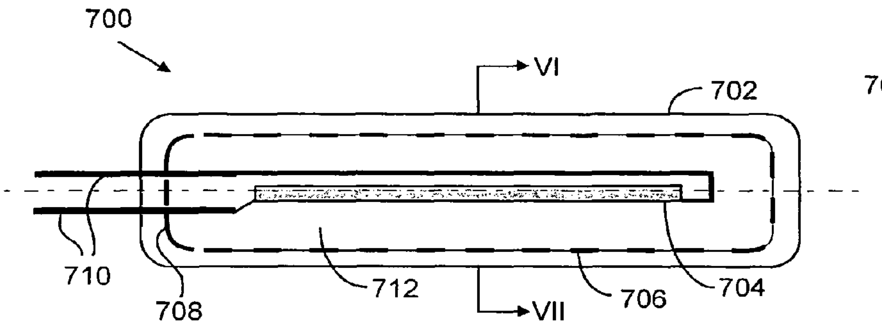
FIG. 7A is a schematic longitudinal cross sectional view of an elongated tubular incandescent light bulb having a sub-wavelength aperture array in accordance with the present invention.
Figure 7B:
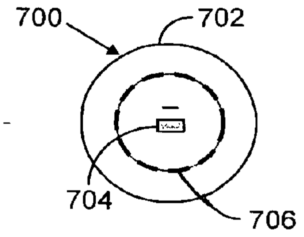
FIG. 7B is a schematic transverse cross sectional view of the incandescent light bulb in FIG. 7A, taken along the line VII-VII.

FIG. 7A is a schematic longitudinal cross sectional view of and/or type of incandescent light bulb shown at 700 and having a sub-wavelength aperture array in accordance with the present invention. FIG. 7B is a cross sectional diagram of the bulb shown in FIG. 7A, taken along the line VII-VII. As depicted in FIGS. 7A-7B, the bulb 700 has a generally cylindrical shape and includes: a bulb envelope 702, preferably formed of, but not limited to, quartz or glass, and forms a cylindrical cavity 712; a linear filament 704 positioned along the longitudinal axis of the cylindrical cavity 712; and power leads 710. A solid film 708 is coated on the base of the bulb envelope 702, while the rest of the envelope 702 is coated with a sub-wavelength aperture array 706 of the type described above to reflect infrared energy back to the filament 704 while passing visible light.

Figure 8:
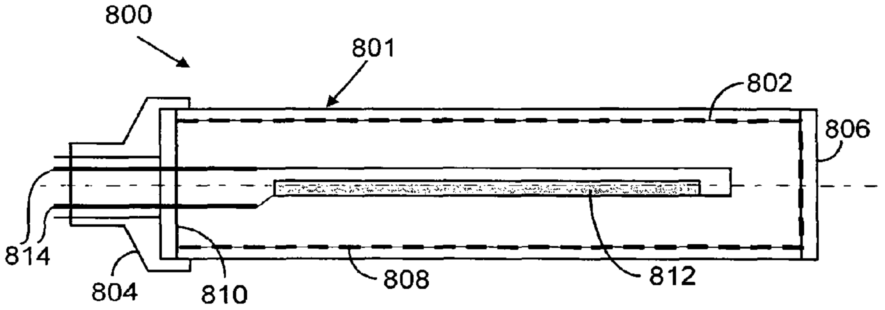
FIG. 8 is a schematic longitudinal cross sectional view of another embodiment of an incandescent light bulb having a sub-wavelength aperture array in accordance with the present invention.

FIG. 8 is a schematic cross sectional view of still another embodiment of incandescent light bulb shown at 800 and having a sub-wavelength aperture array in accordance with the present invention. The bulb 800 has a generally cylindrical shape and includes: a bulb envelope 801 comprised of a cylindrical portion 802, an end cap 806, and a base disk 810; a filament 812 located along the longitudinal axis of the envelope 802; a mounting base 804 for holding the bulb envelope 801; and power leads 814 extending through the disk 810 and connected to the filament 812. The bulb envelope 801 may be formed of optically transparent materials, such as quartz or glass. The mounting base 804 may include a screw or bayonet type connector and have an inner surface with the reflective characteristics of the solid film 708 in FIG. 7A. The end cap 806 and the cylindrical portion 802 are coated with a sub-wavelength aperture array 808 of the type described above to reflect infrared energy back to the filament 812 while passing through visible light. As a variation, the cap 806 may be coated with a solid film so that the no light is passed out of the end of the bulb.

Figure 9:
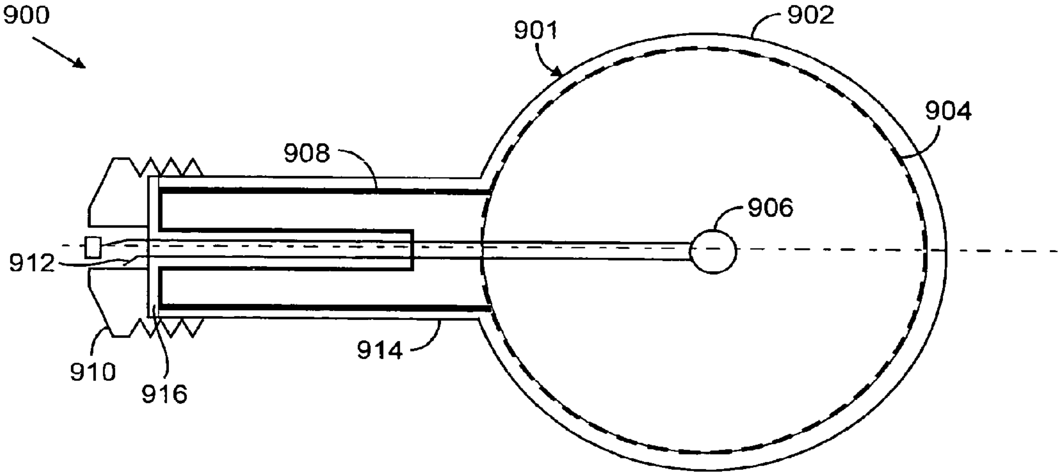
FIG. 9 is a schematic cross sectional view still another embodiment of an incandescent light bulb having a sub-wavelength aperture array in accordance with the present invention.

FIG. 9 is a schematic cross sectional view of yet another type of incandescent light bulb shown at 900 and having a sub-wavelength aperture array in accordance with the present invention. As depicted, the bulb 900 includes: a bulb envelope 901 having a spherical portion 902 internally coated with a sub-wavelength aperture array 904, and a cylindrical portion 914; a base cap 916; a threaded mounting base or connector 910; power leads 912; and a filament 906 located at the center of the spherical portion 902. The filament 906 may be a freestanding coil or a patterned, sputter-deposited layer on a ceramic substrate. The interior surface of the cylindrical portion 914 and base cap 916 may be coated with a solid film 908. As a variation, part of the spherical portion 902 on the base side may be coated with a solid film, making the light bulb more or less unidirectional.

As pointed out above, the sub-wavelength aperture array of the light bulbs in FIGS. 6-9 may be a metallic thin film directly formed on the bulb envelope substrate with .about.300 nm diameter holes. Alternatively, the sub-wavelength aperture array may be a metallic thin film with 500-to-800 nm diameter holes and formed on top of a dielectric hot mirror stack that is deposited on the bulb envelope. In both cases, the film thickness is not critical as long as it is thicker than about 30 nm. In general, the former approach may require finer photolithographic detail than the second approach.

Hole sizes in the film can be varied to alter the "color" of the bulb, e.g., smaller holes will produce "bluer light". This enables use of lower operating temperatures for the filament to significantly prolong life. In this case, filament size (but not power) needs to be increased to provide the same visible light output. In addition, non-circular holes, e.g., square, hexagonal, or elliptical, can also be used to adjust the transmitted light spectrum. Furthermore, an incandescent light bulb having a sub-wavelength aperture array of the type described above can provide a direct replacement for conventional light bulbs, with visible light output efficiencies greater than fluorescent bulbs, while still allowing illumination variation and control using conventional dimmer circuits. In contrast, fluorescent bulbs will not work with mass-market dimmers.

Figure 10A:
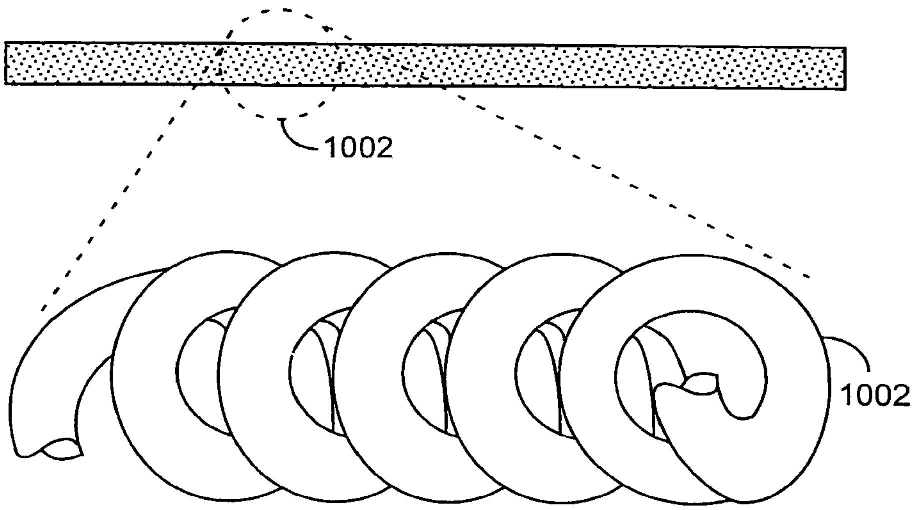
FIG. 10A is a schematic side view of an exemplary linear filament of the type used in the light bulbs of FIGS. 7A-8 and exploded partial segment thereof.

As discussed above, the filaments used in light bulbs of the types shown in FIGS. 6-9 may have various structures and be made of different materials. For example, FIG. 10A is a side view of an exemplary linear filament 1000 of the type used in the light bulbs of FIGS. 7-8 and an enlarged view of a segment 1002 thereof. As depicted, the linear filament 1000 may be formed of a 20-30 micron diameter wire coiled into an elongated rope or helix to shorten overall filament length. The bulb wattage and operating voltage may determine the wire dimension. For instance, a 100-watt, 115-volt filament may require use of a 24 micron diameter wire that is 110 cm long. The elongated linear filament 1000 may alternatively be bent to a desired shape and used in the light bulbs 600 (FIGS. 6) and 900 (FIG. 9).

Figure 10B:
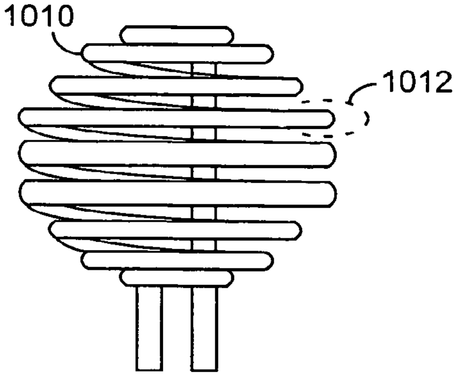
FIG. 10B is a schematic side view of a compact helical filament of a type that might be used in the light bulbs of FIGS. 6 and 9.

FIG. 10B is a schematic side view of a compact helical filament 1010 suitable for use in the light bulbs of the types shown in FIGS. 6 and 9. The filament 1010 may be fabricated by bending a length of linear helical coil, such as depicted at 1000 in FIG. 10A, and the overall dimension of the filament 1010 may be 1-10 mm, for instance. A segment 1012 of the filament 1010 may be similar to the segment 1002 in FIG. 10A except that the segment 1012 would be curved. The filament 1010 may be configured to have a high optical density such that most of the reflected infrared energy is focused thereon and thus absorbed thereby the portion of the reflected light passing through the filament is minimized.

The filaments in FIGS. 10A-10B may be formed of tungsten, for instance, and designed to operate at a temperature of .about.3000.degree. K. As tungsten at .about.3000° K has an emissivity of .about.0.4 in the near infrared wavelength range, only .about.40% of the infrared radiation returning to the filament will be reabsorbed. The remaining 60% will be reflected back towards the bulb envelope for another back-and-forth reflection cycle with additional energy absorption at the filament. To get high bulb efficiency, the number of reflections between leaving and returning to the filament needs to be minimized, and the absorption fraction at the reflecting surfaces, which collectively refers to the sub-wavelength aperture array and the solid film, needs to be minimized. Ideally, all infrared light leaving the filament should be returned by a single reflection from the reflecting surfaces with a reflection factor of at least 90%.

Figure 11:
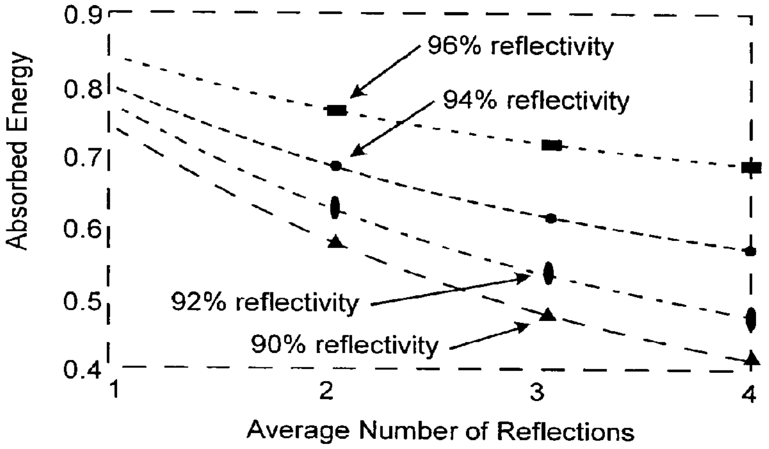
FIG. 11 shows calculated re-absorption fractions of light initially emitted by a filament as a function of film reflectivity and the average number of photon reflections from the film.

FIG. 11 shows calculated re-absorption fractions for long wavelength radiation initially emitted by a filament as a function of film reflectivity, and the average number of photon reflections from the film covered surfaces before returning to the filament. More than 70% of the emitted thermal radiation can be reabsorbed by the filament if the film is at least 90% reflective. Thus, the use of reflecting surfaces having a reflectivity greater than 90% will enable >70% of the input electrical power to be converted into visible light. This is about 7 times more efficient than a conventional incandescent bulb and twice as efficient as a fluorescent bulb. Gold and silver offer >95% reflectivity from 800-to-5000 nm and thus are candidates for the reflecting surfaces. Other metallic materials, such as copper and aluminum, may also be used for the reflecting surfaces.

Figure 12A:
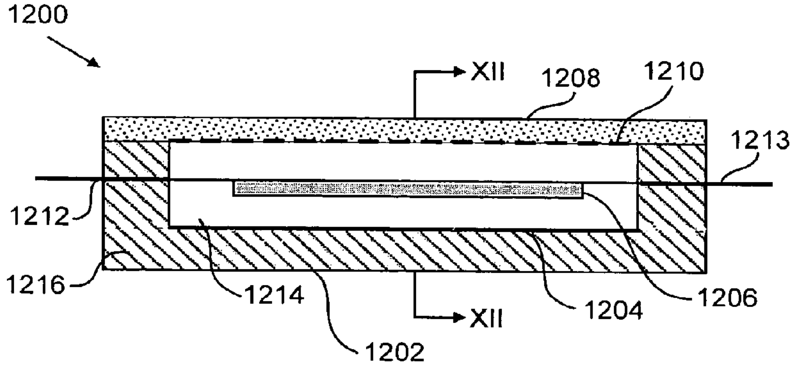
FIG. 12A is a schematic cross sectional view of yet another embodiment of a light bulb in accordance with the present invention.
Figure 12B:
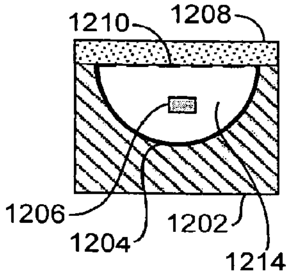
FIG. 12B is a schematic cross sectional view of the light bulb shown in FIG. 12A, taken along the line XII-XII.

Unlike existing LED light sources which use different phosphors or semiconductors to generate different colors, the coating of sub-wavelength aperture array with different aperture sizes on the inner surfaces of incandescent light bulbs can provide, in accordance with another embodiment of the present invention, incandescent bulbs suitable for replacing the LED sources. FIG. 12A is a cross sectional view of a light bulb, shown at 1200, that may be used to replace a conventional LED light source. FIG. 12B is a schematic transverse cross sectional view of the bulb 1200, taken along the line XII-XII. As depicted, the bulb includes: a substrate 1202 having elongated channel or elongated cavity 1214 formed therein to provide an inner surface that is coated with a solid reflective film 1204, and two end walls 1216; a filament 1206; a pair of power leads 1212, 1213 through which power to the filament 1206 is supplied; a cover plate 1208 formed of optically transparent material, such as quartz or glass; and a sub-wavelength aperture array 1210 coated on the inner surface of the cover plate 1208. The filament 1206 may be linear and located at or near the focus of the parabolic reflector cavity formed by the solid film 1204 coated on the surface of the cavity 1214 in the substrate 1202. The radiation reflected from the solid film 1204 will eventually strike the sub-wavelength aperture array 1210 at near normal incidence and thus allows visible light to pass through the apertures and infrared radiation to be reflected back to the filament 1206. The internal cavity 1214 may be under vacuum to minimize conductive losses. As a variation, the inner surfaces of the end walls 1216 may also be coated with solid films.

FIG. 13A is a schematic cross sectional view of another embodiment of a light bulb in accordance with the present invention and which may be used to replace a conventional LED light source. FIG. 13B is a schematic transverse cross sectional view of the light bulb 1300, taken along the line XIII-XIII. As depicted, the bulb 1300 includes: a substrate 1302 having an elongated channel or cavity 1320 formed therein to provide an inner surface that is coated with a pair of solid reflective films 1304; two end walls 1305; a filament 1310; a pair of filament support/power leads 1308 through which power to the filament 1310 is supplied and to which the solid films 1304 are respectively connected; a pair of power pads 1306 formed on the outer surfaces of the substrate 1302 and respectively connected to the solid films 1304; a cover 1314 formed of optically transparent material, such as quartz or glass; and a sub-wavelength aperture array 1312 coated on the inner surface of the cover 1314. The filament 1310 has a linear shape and located at or near the focus of the parabolic reflector cavity formed by the film 1312 coated on the cover 1314. Infrared light reflected by the sub-wavelength aperture 1312 will strike the solid films 1304 at near normal incidence, and retrace its path back to the filament 1310 to be absorbed thereby. The internal cavity 1320 of the light bulb 1300 is under vacuum to minimize conductive losses. It is noted that the solid films 1304 functions as power conductors to the filament 1310. A narrow gap 1316 electrically isolates the two solid films 1304 from each other and respectively coupled to the two ends of the filament 1310. As a variation, the inner surfaces of the side walls 1305 may be coated with solid reflective films.

The filaments 1206 (FIG. 12A) and 1310 (FIG. 13A) are formed of coiled tungsten wire of the type shown in FIG. 10A. Alternatively, the filaments 1206, 1310 might be planar filaments that are deposited and patterned on ceramic materials by using conventional semiconductor or MEMS processing techniques, such as batch fabrication technique.

FIG. 14 shows an exemplary planar filament 1400 that can be used in the light bulbs of FIGS. 12A-13B. The length (when stretched), width, and thickness of the filament 1400 may be 1.4 cm, 2 microns, and 2 microns. 2 micron wide traces, separated by 1 micron gaps, may yield a 600 micron long (L) by 70 micron wide (W) filament 1400. It should be apparent to those of ordinary skill that the length and width of the filament 1400 may be changed depending on the wattage and voltage of the filament.

Applications of the sub-wavelength aperture may include efficient lighting in harsh environments (space, reactors, etc.) and common terrestrial environments. They may be also used as single lamps and arrays of lamps for alphanumeric displays, flat panel displays, and efficient backlighting for liquid crystal displays. A more efficient backlight may extend battery-powered laptop, PDA, cell phone, etc., operation without sacrificing image brightness.

Figure 15A:
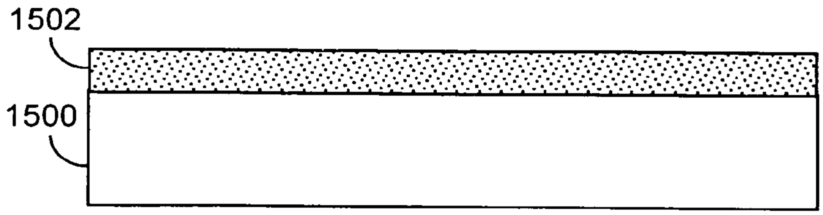
FIGS. 15A-15E show exemplary steps that might be followed in forming one embodiment of a sub-wavelength aperture array on a substrate in accordance with the present invention.
Figure 15B:
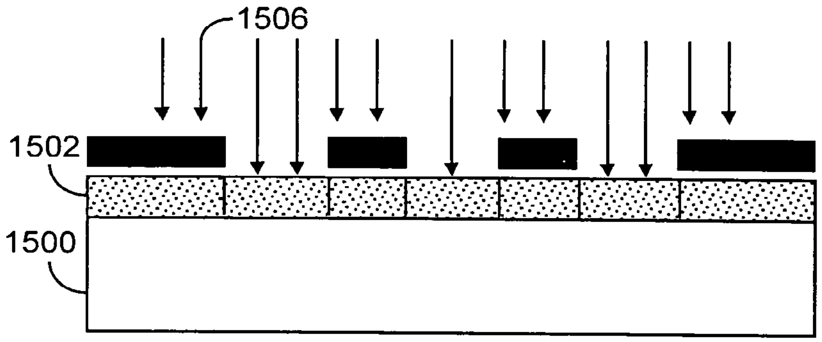
Figure 15C:
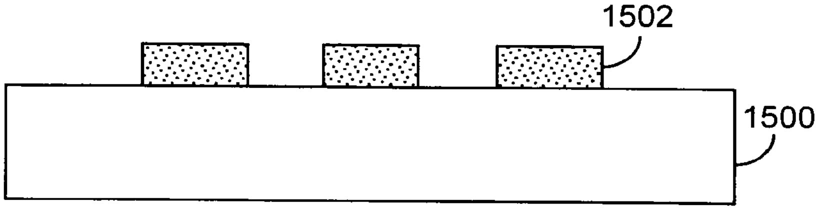
Figure 15D:
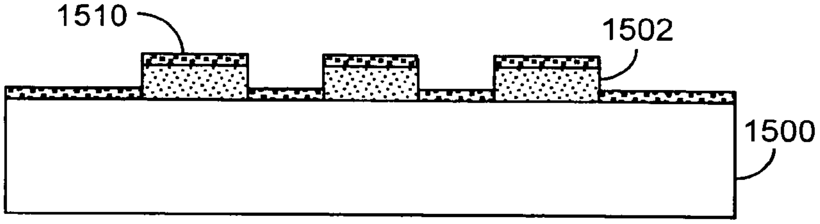
Figure 15E:
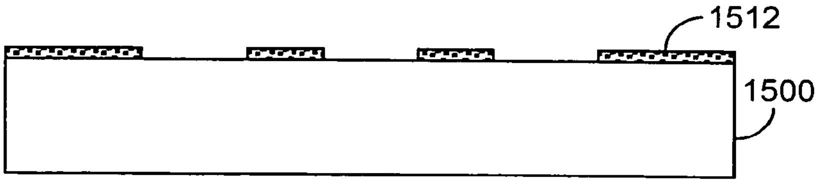

As discussed above, conventional techniques, such as lift-off patterning, masked reactive ion etching, shadow mask deposition, and direct-write laser deposition, may be used to create a sub-wavelength aperture array on a substrate. FIGS. 15A-15E show exemplary steps followed in forming a sub-wavelength aperture array on a substrate by use of a lift-off patterning technique. As depicted in FIG. 15A, a photoresist layer 1502 is first formed on a substrate 1500, such as the cap 605 in FIG. 6, for instance. Then, a mask 1504 is arranged above the photoresist layer 1502 and radiation is projected through the transparent openings of the mask so that the pattern in the mask is transferred onto the photoresist layer 1502, as shown in FIG. 15B and the exposed portions of the resist layer are hardened. Subsequently, as depicted in FIG. 15C, the unexposed portion of the layer 1502 is selectively removed to reveal the surface of the substrate 1500. Next, as shown in FIG. 15D, a reflective layer 1510 is deposited on the exposed surfaces of the substrate 1500 and the resist layer 1502. Finally, the remaining portions of the resist layer 1502 are lifted off to leave a patterned film 1512 on the substrate 1500, as shown in FIG. 15E.

FIGS. 16A-16C show exemplary steps followed in forming a sub-wavelength aperture array on a substrate by use of a nano-imprinting technique in accordance with the present invention. As depicted in FIG. 16A, a layer 1602 may be formed on a substrate 1600, wherein the layer is made of photoresist or other indentable material such as a polymer. Then, a previously prepared nanopatterned indenter 1604 is brought into in engagement with the substrate 1600 to transfer an intended pattern onto the layer 1602, as shown in FIGS. 16B and 16C. Subsequently, the steps previously described with respect to FIGS. 15D and 15E are conducted to form a sub-wavelength aperture array on the substrate 1600.

FIGS. 17A-17C show exemplary steps for forming a sub-wavelength aperture array on a substrate in accordance with yet another embodiment of the present invention. As depicted in FIG. 17A, a photoresist layer 1702 is first formed on a substrate 1700. Then, a mask 1704 is arranged below the substrate 1700 and radiation 1708, such as X-rays, is projected through the transparent openings of the mask 1708 and the substrate to transfer a pattern in the mask 1704 onto the photoresist layer 1702, as shown in FIG. 17B. Subsequently, as depicted in FIG. 17C, the unexposed portions of the layer 1702 are selectively removed to reveal the surface of the substrate 1700. Next, the steps illustrated in FIGS. 15D-15E are conducted to form a sub-wavelength aperture array on the upper surface of the substrate 1700. It is noted that the mask 1704 may be applied to outside light bulbs.

Figure 18:
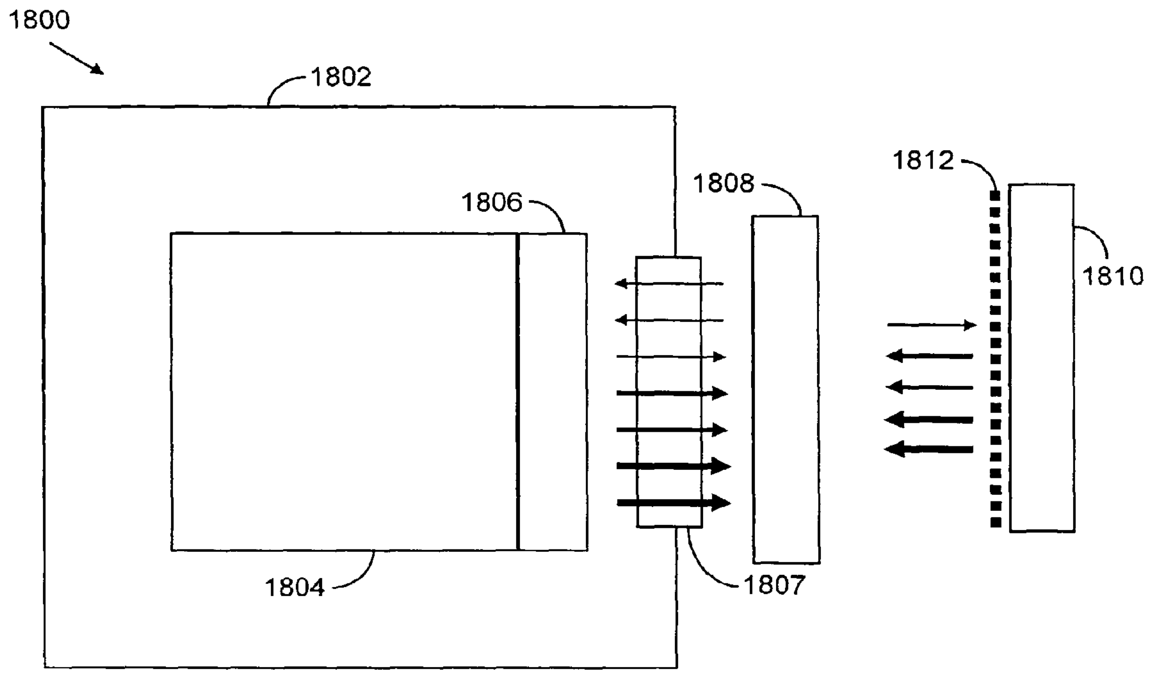
FIG. 18 is a schematic diagram illustrating a thermo-photovoltaic power generator including selective emitter and a sub-wavelength aperture array in accordance with the present invention.

FIG. 18 is a schematic diagram of a thermo-photovoltaic (TPV) power generator shown at 1800 and having a 1812 in accordance with the present invention. As depicted, the thermo-photovoltaic (TPV) power generator 1800 includes: a reflective cavity 1802 including a transparent window 1807 through which radiation passes; a heat source 1804 for generating heat energy; a selective thermal emitter (or, selective emitter) 1806 for emitting thermal radiation with black body emissivity at particular wavelengths (such as the photonic bandgap selective emitter disclosed in U.S. Pat. No. 6,583,350 and incorporated herein by reference); a dichroic cold mirror 1808 for reflecting short wavelength light back to the selective emitter 1806; a sub-wavelength aperture array 1812 for reflecting long wavelength light back to the selective emitter 1806; and low-bandgap photovoltaic cells 1810 for heat-to-electricity conversion. The selective emitter 1806 is formed of rare-earth ceramics.

The photovoltaic cell 1810 may be made of gallium antimonide (GaSb), for instance, in which case, wavelengths longer than 1.59 microns will not produce power in the cell because the photon energy is lower than the cell bandgap energy of 0.78 eV. The most efficient energy production may occur at wavelengths slightly shorter than the bandgap energy because any photon energy in excess of 0.78 eV will be wasted as heat within the photovoltaic cell 1810. As such, the overall efficiency of the TPV power generator 1800 may be increased by using a combination of the dichroic cold mirror 1808 for reflecting short wavelength radiation and sub-wavelength aperture array 1812 for reflecting radiation longer than 1.59 micron, wherein the film 1812 combined with the mirror 1808 may form a band pass filter.

Figure 19:
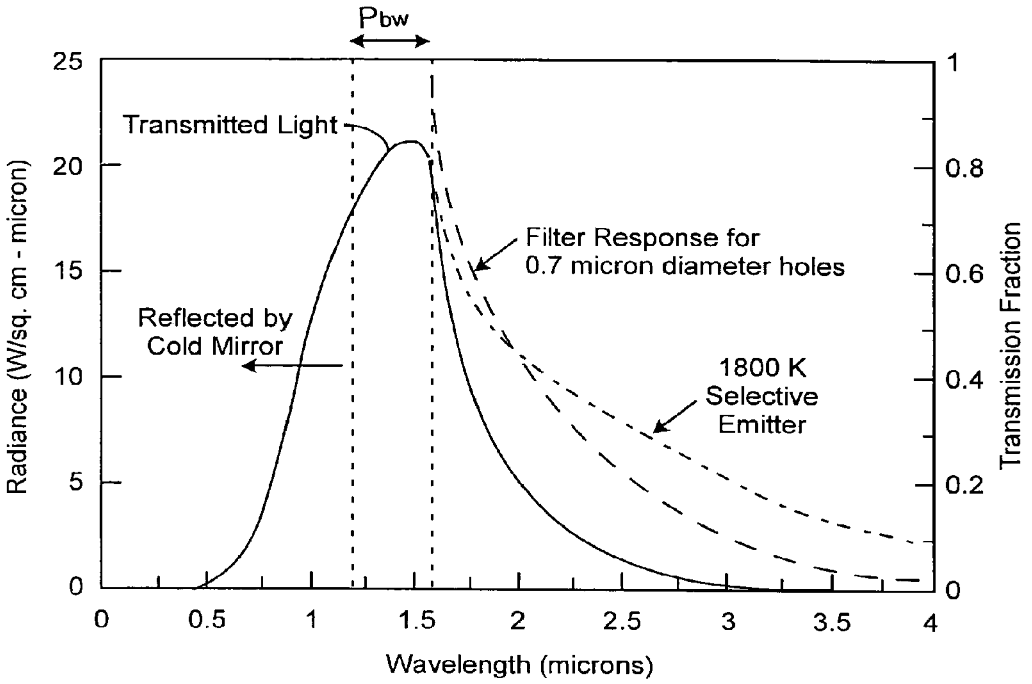
FIG. 19 is an emission spectrum for the thermo-photovoltaic power generator shown in FIG. 18.

FIG. 19 shows the emission spectrum of the selective emitter 1806 at 1800.degree. K with a suitable bandpass created by 700-nm diameter apertures in a film 1812 and a 1200-nm cutoff dichroic cold mirror 1808. The dichroic cold mirror 1808 operates as a 1200-nm cutoff high pass filter, while the P.sub.bw represents the wavelength range converted into electricity by the photovoltaic cell 1810. The sub-wavelength aperture array 1812 reflects infrared radiation from 1600-to-5000 nm (and longer) back to the selective emitter 1806. With this approach, thermal-to-electric conversion efficiencies >40% are possible in the TPV power generator 1800. As a variation, the TPV power generator 1800 may include a sub-wavelength aperture array deposited on the surface of the dichroic cold mirror 1808.

As discussed above, TPV power generator efficiency can be enhanced using sub-wavelength aperture array thin film reflectors. The enhanced heat-to-electrical conversion efficiency of the TPV power generator 1800 significantly reduces waste of thermal energy. Other applications of the sub-wavelength aperture array may include terrestrial power generators using solar heat or fuel combustion, and space power reactors.

It is noted that the sub-wavelength aperture array for use in the embodiments of the present invention includes holes or openings. The openings have various shapes, such as circular, ellipsoidal, square, rectangular, rhomboidal, and polygonal. These openings provide near 100% transmission at short wavelengths and different from the cross-like openings described in the technical paper, “Rapid Prototyping of Infrared Bandpass Filters Using Aperture Array Lithography,” K. Han, M. Morgan, A. Ruiz, S. C. Vernula and P. Ruchhoeft, Jour. Vac. Sci. & Tech., B 23 (6), November/December 2005, pp. 3158-3163, wherein the cross-like openings operate as a narrow bandpass filter.

It should be understood, of course, that the foregoing relates to exemplary embodiments of the invention and that modifications may be made without departing from the spirit and scope of the invention as set forth in the following claims.

What is claimed is:

1. A device for generating electric energy, comprising:

a heat source for generating heat energy;

a thermal emitter operative to receive said heat energy and to emit thermal radiation with black body emissivity;

a housing forming a reflective cavity enclosing said heat source and said thermal emitter, and having a transparent window through which thermal radiation emitted by said thermal emitter is passed;

photovoltaic cell means located outside said reflective cavity and positioned to receive thermal radiation passing through said transparent window, said cell means being operative to convert thermal radiation within a particular wavelength range into electric energy; and a band pass filter disposed outside of said reflective cavity and between said window and said photovoltaic cell means, said band pass filter having a first cutoff wavelength on one side of said particular wavelength range converted into electricity by said photovoltaic cell means, and a second cutoff wavelength on the opposite side of said particular wavelength range converted into electricity by said photovoltaic cell means, said band pass filter including, a non-resonant sub-wavelength aperture array consisting of a layer of metallic material forming a reflective thin film disposed between said window and said cell means, and having a film thickness greater than 30 nm and a plurality of transparent openings formed therein, the size and shape of said openings being selected to transmit thermal radiation having wavelengths shorter than said first cutoff wavelength, said reflective thin film being operative to reflect radiation having wavelengths longer than said first cutoff wavelength back to said emitter through said window, and a dichroic cold mirror interposed between said window and said reflective thin film, said dichroic cold mirror being operative to transmit thermal radiation having wavelengths longer than said second cutoff wavelength and to reflect radiation having wavelengths shorter than said second cutoff wavelength back to said emitter through said window, whereby radiation from said thermal emitter having wavelengths within the pass band of said band pass filter is transmitted to said photovoltaic cell means for conversion into electric energy, and thermal radiation having wavelengths outside said pass band is reflected back to said thermal emitter to be re-absorbed thereby to enhance the conversion efficiency of the device.

2. A device for generating electric energy as recited in claim 1, wherein the size and shape of said openings cause said first cut-off wavelength to be the wavelength having the same energy as the bandgap energy of said photovoltaic cell means, and said cold mirror causes said second cut-off wavelength to correspond to the lower limit of the wavelength range converted into electric energy by said photovoltaic cell means.

3. A device for generating electric energy as recited in claim 1, wherein said first cutoff wavelength is the wavelength equal to approximately 2.5 times the effective diameter of said transparent openings.

4. A device for generating electric energy as recited in claim 1, wherein said reflective thin film is formed on a surface of said dichroic cold mirror facing said transparent window.

5. A device for generating electric energy as recited in claim 1, wherein said reflective thin film is formed on a surface of said photovoltaic cell means facing said transparent window.

6. A thermo-photovoltaic power generator for efficiently converting thermal energy into electric energy, comprising:

a thermal emitter for receiving thermal energy and emitting thermal radiation with black body emissivity over a range of wavelengths;

low-bandgap photovoltaic cell means responsive to thermal radiation at wavelengths within a particular band of said range of wavelengths defined by first and second cut-off wavelengths, and operative to convert such thermal radiation to electric energy; and a band-pass filter disposed between said thermal emitter and said photovoltaic cell means for transmitting thermal radiation from said thermal emitter having wavelengths within said particular band to said photovoltaic cell means, and for reflecting thermal radiation having wavelengths outside said particular band back to said thermal emitter for re-absorpsion thereby, said band-pass filter including, a non-resonant sub-wavelength aperture array consisting of a layer of reflective material forming a thin film disposed between said thermal emitter and said photovoltaic cell means, and having a film thickness greater than 30 nm and a plurality of transparent sub-micron openings formed therein, the size and shape of said openings being selected to transmit thermal radiation having wavelengths shorter than said first cutoff wavelength, said reflective thin film being operative to reflect radiation having wavelengths longer than said first cutoff wavelength, and a dichroic cold mirror disposed between said thermal emitter and said thin film, said dichroic cold mirror being operative to transmit thermal radiation having wavelengths longer than said second cutoff wavelength, and to reflect radiation having wavelengths shorter than said second cutoff wavelength, whereby radiation from said thermal emitter having wavelengths within the pass band of said band-pass filter is transmitted to said photovoltaic cell means for conversion into electric energy, and thermal radiation having wavelengths outside the pass band is reflected back to said thermal emitter to be re-absorbed thereby to enhance the conversion efficiency of the device.

7. A thermo-photovoltaic power generator as recited in claim 6 wherein the size and shape of said openings cause said first cut-off wavelength to be the wavelength having the same energy as the bandgap energy of said photovoltaic cell means, and said cold mirror causes said second cut-off wavelength to correspond to the lower limit of the wavelength range converted into electric energy by said photovoltaic cell means.

8. A thermo-photovoltaic power generator as recited in claim 6 wherein said sub-micron openings formed in said thin film have effective widths defined by said first cutoff wavelength.

9. A thermo-photovoltaic power generator as recited in claim 6 wherein said thermal emitter is formed of rare-earth ceramics.

10. A thermo-photovoltaic power generator as recited in claim 6 and further comprising:

a source of heat for heating said thermal emitter; and means forming a reflective cavity containing said source of heat and said thermal emitter, and including a transparent window through which said thermal radiation passes to and from said band-pass filter, the reflective cavity means being operative to focus heat from said source and/or the reflected thermal radiation back onto said thermal emitter.

11. A thermo-photovoltaic power generator as recited in claim 6 wherein said photovoltaic cell means is made at least in part of gallium antimonide (GaSb).

12. A thermo-photovoltaic power generator comprising:

means forming a reflective cavity and including a transparent window;

a heat source disposed within said cavity for generating thermal energy; and a thermal emitter formed of rare-earth ceramic material disposed within said cavity between said heat source and said transparent window and configured to emit and direct thermal radiation with black body emissivity over a range of wavelengths through said window;

low-bandgap photovoltaic cell means disposed outside said cavity and near said window for converting thermal radiation having wavelengths within a particular band of said range of wavelengths to electric energy; and a band-pass filter disposed between said window and said photovoltaic cell means for transmitting thermal radiation from said thermal emitter at wavelengths within said particular band to said photovoltaic cell means, and for reflecting thermal radiation at wavelengths outside said particular band back to said thermal emitter for re-absorption thereby, said band-pass filter including a non-resonant sub-wavelength aperture array defining one cut-off wavelength of said band-pass filter, for transmitting thermal radiation having wavelengths shorter than said one cut-off wavelength to said said photovoltaic cell means and for reflecting long wavelength radiation back to said thermal emitter, and further including high-pass filter means defining another cut-off wavelength of said band-pass filter, for transmitting thermal radiation having wavelengths longer than said another cut-off wavelength to said photovoltaic cell means and for reflecting short wavelength radiation back to said selective emitter.

13. A thermo-photovoltaic power generator as recited in claim 12 wherein said aperture array includes a reflective thin film having a plurality of openings formed therein, the size and shape of which cause said one cut-off wavelength to be the wavelength having the same energy as the bandgap energy of said photovoltaic cell means, and said high-pass filter means causes said another cut-off wavelength to correspond to the lower limit of the wavelength range converted into electric energy by said photovoltaic cell means.

14. A thermo-photovoltaic power generator as recited in claim 12 wherein said thin film has a thickness greater than 30 nm and said openings function as a non-waveguide low-pass filter component of said band-pass filter and to transmit radiant energy having wavelengths shorter than said one cut-off wavelength, said thin film having a reflectivity in excess of 90%.

15. A thermo-photovoltaic power generator as recited in claim 12 wherein said sub-wavelength aperture array is formed on a face of said photovoltaic cell means.

16. A thermo-photovoltaic power generator as recited in claim 12 wherein said sub-wavelength aperture array is formed on a face of said dichroic cold mirror.

17. A thermo-photovoltaic power generator as recited in claim 14 wherein said sub-wavelength aperture array openings have shapes selected from the group of shapes consisting of circular, ellipsoidal, square, rectangular, rhomboidal, and polygonal.

18. A device for generating electric energy as recited in claim 1 wherein said openings have shapes selected from the group of shapes consisting of circular, ellipsoidal, square, rectangular, rhomboidal, and polygonal.

19. A thermo-photovoltaic power generator as recited in claim 6 wherein said sub-wavelength aperture array includes openings having shapes selected from the group of shapes consisting of circular, ellipsoidal, square, rectangular, rhomboidal, and polygonal.

* * * * *